United States Patent
Liu

(10) Patent No.: US 7,863,595 B2
(45) Date of Patent: Jan. 4, 2011

(54) REPRODUCIBLE RESISTANCE VARIABLE INSULATING MEMORY DEVICES HAVING A SHAPED BOTTOM ELECTRODE

(75) Inventor: Jun Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/407,510

(22) Filed: Mar. 19, 2009

(65) Prior Publication Data

US 2009/0179188 A1 Jul. 16, 2009

Related U.S. Application Data

(63) Continuation of application No. 11/203,141, filed on Aug. 15, 2005, now Pat. No. 7,521,705.

(51) Int. Cl.
*H01L 29/02* (2006.01)
(52) U.S. Cl. .......... 257/2; 257/3; 257/4; 257/5; 438/102; 438/103; 365/163
(58) Field of Classification Search ............... 257/1–5, 257/E29.002; 438/102–103; 365/163
See application file for complete search history.

(56) References Cited

U.S. PATENT DOCUMENTS

| | | | | |
|---|---|---|---|---|
| 5,292,717 | A * | 3/1994 | Roas | ............... 505/401 |
| 5,804,908 | A | 9/1998 | Yano | |
| 6,849,891 | B1 | 2/2005 | Hsu et al. | |
| 2001/0010837 | A1 | 8/2001 | Horie et al. | |
| 2001/0050218 | A1 | 12/2001 | Tabatabaie-Raissi et al. | |
| 2002/0000296 | A1 | 1/2002 | Terada et al. | |
| 2002/0033378 | A1 | 3/2002 | Hayashi et al. | |
| 2002/0037647 | A1 | 3/2002 | Hwang et al. | |
| 2002/0067317 | A1 | 6/2002 | Sakurada | |
| 2002/0067917 | A1 | 6/2002 | Takamatsu et al. | |
| 2002/0072006 | A1 | 6/2002 | Mizoo et al. | |
| 2002/0106313 | A1 | 8/2002 | Tabatabaie-Raissi et al. | |
| 2002/0134685 | A1 | 9/2002 | Chakravorty et al. | |

(Continued)

FOREIGN PATENT DOCUMENTS

TW 486710 5/2002

(Continued)

OTHER PUBLICATIONS

A. Beck, J.G. Bedmorz, CH. Gerber, C. Rossel and D. Widmer, *Reproducible Switching Effect in This Oxide Films for Memory Applications*, Applied Physics Letters, Jul. 3, 2000, vol. 77, No. 1, pp. 139-141.

(Continued)

*Primary Examiner*—Bradley K Smith
*Assistant Examiner*—Jami M Valentine
(74) *Attorney, Agent, or Firm*—Dickstein Shapiro LLP

(57) ABSTRACT

The present invention relates to the use of a shaped bottom electrode in a resistance variable memory device. The shaped bottom electrode ensures that the thickness of the insulating material at the tip of the bottom electrode is thinnest, creating the largest electric field at the tip of the bottom electrode. The arrangement of electrodes and the structure of the memory element makes it possible to create conduction paths with stable, consistent and reproducible switching and memory properties in the memory device.

19 Claims, 8 Drawing Sheets

U.S. PATENT DOCUMENTS

| | | |
|---|---|---|
| 2003/0024389 A1 | 2/2003 | Flippo et al. |
| 2003/0041801 A1 | 3/2003 | Hehmann |
| 2003/0047070 A1 | 3/2003 | Flippo et al. |
| 2003/0059720 A1 | 3/2003 | Hwang et al. |
| 2003/0064590 A1 | 4/2003 | Hwang |
| 2003/0071255 A1 | 4/2003 | Xu |
| 2003/0085111 A1 | 5/2003 | Tabatabaie-Raissi et al. |
| 2003/0098531 A1 | 5/2003 | Horie et al. |
| 2003/0132376 A1 | 7/2003 | Bonnell et al. |
| 2003/0168342 A1 | 9/2003 | Chakravorty et al. |
| 2003/0222295 A1 | 12/2003 | Lin |
| 2004/0016948 A1 | 1/2004 | Lin |
| 2004/0029404 A1 | 2/2004 | Lin |
| 2004/0032823 A1 | 2/2004 | Kikuchi et al. |
| 2004/0037205 A1 | 2/2004 | Shinoda et al. |
| 2004/0037206 A1 | 2/2004 | Shinoda |
| 2004/0059455 A1 | 3/2004 | Kawahara et al. |
| 2004/0077123 A1 * | 4/2004 | Lee et al. .................... 438/102 |
| 2004/0104417 A1 | 6/2004 | Song et al. |
| 2004/0105810 A1 | 6/2004 | Ren et al. |
| 2004/0108596 A1 | 6/2004 | Seshan |
| 2004/0110562 A1 | 6/2004 | Kajino et al. |
| 2004/0113084 A1 | 6/2004 | Nakata et al. |
| 2004/0114502 A1 | 6/2004 | Takahashi et al. |
| 2004/0147047 A1 * | 7/2004 | Cross et al. .................... 438/3 |
| 2004/0150043 A1 | 8/2004 | Holm et al. |
| 2004/0159828 A1 | 8/2004 | Rinerson et al. |
| 2004/0159868 A1 | 8/2004 | Rinerson et al. |
| 2004/0159869 A1 | 8/2004 | Rinerson et al. |
| 2004/0160804 A1 | 8/2004 | Rinerson et al. |
| 2004/0160805 A1 | 8/2004 | Rinerson et al. |
| 2004/0160806 A1 | 8/2004 | Rinerson et al. |
| 2004/0160807 A1 | 8/2004 | Rinerson et al. |
| 2004/0160808 A1 | 8/2004 | Rinerson et al. |
| 2004/0160817 A1 | 8/2004 | Rinerson et al. |
| 2004/0160818 A1 | 8/2004 | Rinerson et al. |
| 2004/0160819 A1 | 8/2004 | Rinerson et al. |
| 2004/0160820 A1 | 8/2004 | Rinerson et al. |
| 2004/0160841 A1 | 8/2004 | Rinerson et al. |
| 2004/0160846 A1 | 8/2004 | Rinerson et al. |
| 2004/0160847 A1 | 8/2004 | Rinerson et al. |
| 2004/0160848 A1 | 8/2004 | Rinerson et al. |
| 2004/0160849 A1 | 8/2004 | Rinerson et al. |
| 2004/0161888 A1 | 8/2004 | Rinerson et al. |
| 2004/0170040 A1 | 9/2004 | Rinerson et al. |
| 2004/0173837 A1 | 9/2004 | Agarwal et al. |
| 2004/0180453 A1 | 9/2004 | Kim et al. |
| 2004/0180542 A1 * | 9/2004 | Nagashima et al. ......... 438/679 |
| 2004/0183116 A1 | 9/2004 | Cho et al. |
| 2004/0195613 A1 | 10/2004 | Kweon |
| 2004/0201096 A1 | 10/2004 | Iijima et al. |
| 2004/0201818 A1 | 10/2004 | Yamamoto et al. |
| 2004/0219762 A1 | 11/2004 | Shimoda et al. |
| 2004/0223786 A1 | 11/2004 | Hasegawa et al. |
| 2004/0232430 A1 | 11/2004 | Lempkowski et al. |
| 2004/0232431 A1 | 11/2004 | Lempkowski et al. |
| 2004/0238942 A1 | 12/2004 | Chakravorty et al. |
| 2004/0240375 A1 | 12/2004 | Shinoda |
| 2004/0247815 A1 | 12/2004 | Takamori et al. |
| 2004/0256697 A1 | 12/2004 | Jang |
| 2004/0257749 A1 | 12/2004 | Otsuka et al. |
| 2004/0264355 A1 | 12/2004 | Takamori et al. |
| 2004/0266028 A1 | 12/2004 | Rodriguez et al. |
| 2005/0013172 A1 | 1/2005 | Rinerson et al. |
| 2005/0018516 A1 | 1/2005 | Chevallier et al. |
| 2005/0029573 A1 | 2/2005 | Sato et al. |
| 2005/0036939 A1 | 2/2005 | Wong et al. |
| 2005/0040481 A1 | 2/2005 | Shimizu et al. |
| 2005/0042836 A1 | 2/2005 | Lee et al. |
| 2005/0045933 A1 | 3/2005 | Kimura et al. |
| 2005/0051870 A1 | 3/2005 | Yamazaki et al. |
| 2005/0059208 A1 | 3/2005 | Clampitt |
| 2005/0066993 A1 | 3/2005 | Hasebe et al. |
| 2005/0082726 A1 | 4/2005 | Hilmas et al. |
| 2005/0101714 A1 | 5/2005 | Yamasaki et al. |
| 2005/0105038 A1 | 5/2005 | Kondo et al. |
| 2005/0106839 A1 | 5/2005 | Shimoda et al. |
| 2005/0111263 A1 | 5/2005 | Rinerson et al. |
| 2005/0121240 A1 | 6/2005 | Aase et al. |
| 2005/0127403 A1 | 6/2005 | Hsu |
| 2005/0128840 A1 | 6/2005 | Rinerson |
| 2005/0167699 A1 | 8/2005 | Sugita et al. |
| 2005/0180189 A1 | 8/2005 | Happ et al. |
| 2006/0002174 A1 | 1/2006 | Hosoi et al. |
| 2006/0006471 A1 | 1/2006 | Rossel et al. |
| 2006/0027893 A1 | 2/2006 | Meijer et al. |
| 2006/0131556 A1 * | 6/2006 | Liu et al. ....................... 257/5 |
| 2006/0160304 A1 * | 7/2006 | Hsu et al. ................... 438/257 |

FOREIGN PATENT DOCUMENTS

| | | |
|---|---|---|
| WO | WO 2004/017436 A2 | 2/2004 |

OTHER PUBLICATIONS

M.J. Rozenberg, I.H. Inoue, and M.J. Sanchez, *Nonvolatile Memory With Multilevel Switching: A Basic Model*, Physical Review Letters, Week Ending Apr. 30, 2004, vol. 92, No. 17, pp. 178302-1-178302-4.

C. Rossel, G.I. Meijer, D. Bremaud, and D. Widmer, *Electrical Current Distribution Across a Metal-Insulator-Metal Structure During Bistable Switching*, Journal of Applied Physics, Sep. 15, 2001, vol. 90, No. 1, pp. 2892-2898.

\* cited by examiner

REPRODUCIBLE RESISTANCE VARIABLE INSULATING MEMORY DEVICES HAVING A SHAPED BOTTOM ELECTRODE

CROSS REFERENCE TO RELATED APPLICATIONS

The present application is a continuation of application Ser. No. 11/203,141, filed Aug. 15, 2005 now U.S. Pat. No. 7,521,705, the entire disclosure of which is incorporated herein by reference.

FIELD OF THE INVENTION

The invention relates to the field of random access memory (RAM) devices formed using a resistance variable material, and in particular to an improved structure for, and a method of manufacturing, a resistance variable memory element.

BACKGROUND OF THE INVENTION

Resistance variable memory is a RAM that has electrical resistance characteristics that can be changed by external influences. The basic component of a resistance variable memory cell is a variable resistor. The variable resistor can be programmed to have high resistance or low resistance (in two-state memory circuits), or any intermediate resistance value (in multi-state memory circuits). The different resistance values of the resistance variable memory cell represent the information stored in the resistance variable memory circuit. The advantages of resistance variable memory are the simplicity of the circuit, leading to smaller devices, the non-volatile characteristic of the memory cell, and the stability of the memory states.

FIG. 1 shows a cross-section of a conventional resistance variable memory device. This resistance variable memory device is a Type GRAD (one resistor, one diode) memory device. It includes a word line (N type region) 102 in substrate 100, a plurality of P+ regions 104 and N+ regions 106, wherein word line 102 and P+ region 104 constitute a diode. A dielectric layer 114 is formed over substrate 100. A plurality of memory units 107 are set in dielectric layer 114, wherein each memory unit 107 includes a flat plate bottom electrode 108, a flat plate top electrode 110, and a resistive film 112, which may be formed of one or more layers, between the flat plate bottom electrode 108 and the flat plate top electrode 110. Word line contact via 116 is formed in dielectric layer 114. One end of word line contact via 116 is electrically connected to N+ region 106; the other end is electrically connected to a conducting line 120 on the surface of dielectric layer 114 so that the word line 102 can electrically connect with external circuits. Furthermore, there is a bit line 118 formed on dielectric layer 114 for electrically connecting with top electrode 110 of the memory unit 107.

A second example of a conventional resistance variable memory device is a Type 1R1T (one resistor one transistor) memory device illustrated in FIG. 2. This device includes a plurality of N+ regions 202 and 204 in substrate 200. A dielectric layer 220 is formed over substrate 200. Dielectric layer 220 includes a plurality of memory units 207, a plurality of gate structures (word lines) 212 and a plurality of contact vias 214 and 216. Each memory unit includes a flat plate bottom electrode 206, a flat plate top electrode 208 and a resistive film 210; which may be formed of one or more material layers, each memory unit is set on the surface of a respective N+ region. Gate structure 212 and N+ regions 202 and 204 constitute a transistor. Contact vias 214 and 216 are electrically connected to the gate structure 212 and the common line 204, respectively, so that the gate structure 212 and the common line 204 can connect with the external circuits. Furthermore, there is a bit line 218 formed on dielectric layer 220 for electrically connecting with the flat plate top electrode 208 of the memory unit 207.

Unfortunately, the metal-insulator-metal (MIM) structure with a resistive film or insulting oxide sandwiched between two flat metallic electrode plates as disclosed in FIGS. 1 and 2 does not provide stable and reproducible switching and does not provide memory properties in a controlled manner, as the conduction path between the elements can occur anywhere in the resistive film or insulating oxide between the top and bottom electrodes. The random and unpredictable conduction path between the elements is believed to be created by random and unpredictable defect sites in the deposited film.

There is needed, therefore, an alternative apparatus for improving and controlling the conduction path between the electrodes in a resistance variable memory device to form large arrays of memory devices based on the resistance switching phenomenon.

BRIEF SUMMARY OF THE INVENTION

The present invention relates to the use of a shaped bottom electrode in a resistance variable memory device. The shaped bottom electrode ensures that the thickness of the insulating material at the tip of the bottom electrode is thinnest, therefore creating the largest electric field at the tip of the bottom electrode. The small curvature of the electrode tip also enhances the local electric field. The arrangement of electrodes and the structure of the memory element makes it possible to create conduction paths with stable, consistent and reproducible switching and memory properties in the memory device.

Additional advantages and features of the present invention will be apparent from the following detailed description and drawings which illustrate preferred embodiments of the invention.

DETAILED DESCRIPTION OF THE INVENTION

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention. The progression of processing steps described is exemplary of embodiments of the invention; however, the sequence of steps is not limited to that set forth herein and may be changed as is known in the art, with the exception of steps necessarily occurring in a certain order.

The term "substrate" used in the following description may include any supporting structure including, but not limited to, a plastic, ceramic, semiconductor, or other substrate that has an exposed substrate surface. A semiconductor substrate should be understood to include silicon, silicon-on-insulator (SOI), silicon-on-sapphire (SOS), doped and undoped semiconductors, epitaxial layers of silicon supported by a base semiconductor foundation, and other semiconductor material structures. When reference is made to a semiconductor substrate or wafer in the following description, previous process steps may have been utilized to form regions or junctions in or over the base semiconductor or foundation.

The invention will now be explained with reference to the figures, which illustrate exemplary embodiments and where like reference numbers indicate like features.

Figure 1:
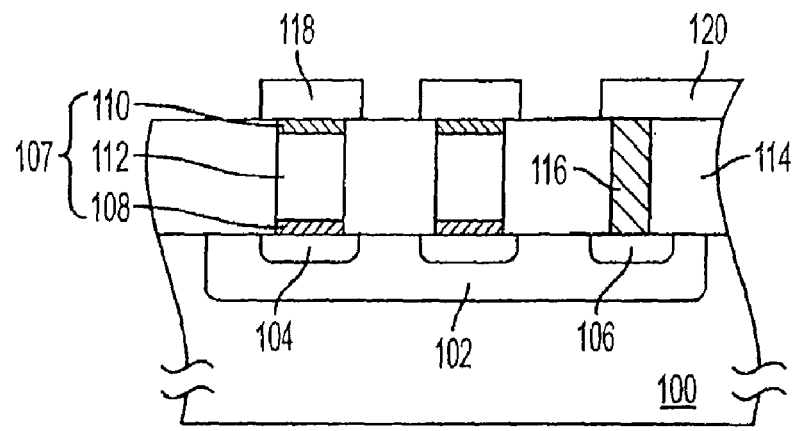
FIG. 1 shows a cross-section of a conventional resistance random access memory device.
Figure 2:
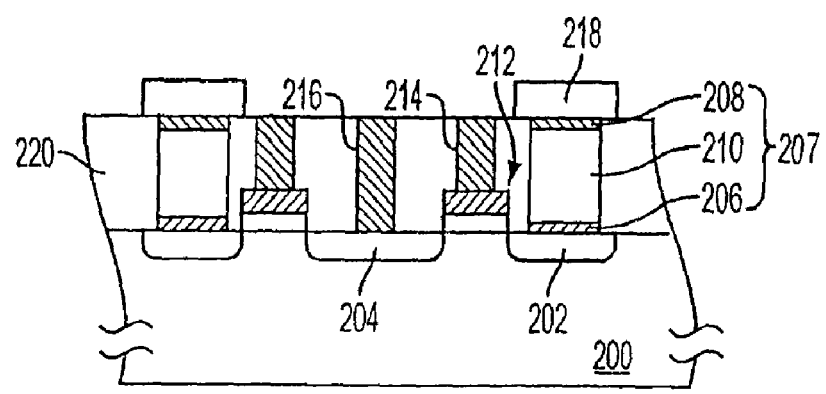
FIG. 2 shows a cross-section of another conventional resistance random access memory device.
Figure 3:
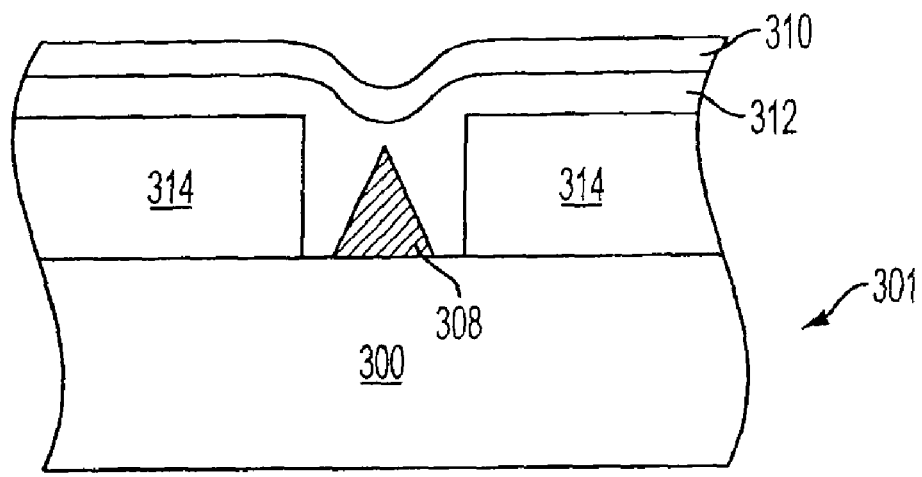
FIG. 3 illustrates a partial cross-section of a memory device in accordance with an exemplary embodiment of the present invention.

A memory device 301 according to an embodiment of the invention is schematically illustrated in FIG. 3. The device 301 includes a shaped bottom electrode 308, a top electrode 310, a dielectric layer 314, and a resistance variable insulating material 312 between the shaped bottom electrode 308 and the top electrode 310. In a preferred embodiment of the invention, the resistance variable insulating material 312 is formed from resistance-reversible materials such as colossal magnet resistive thin films, such as, for example a PCMO thin film (i.e., $Pr_{0.7}Ca_{0.3}MnO_3$); oxidation films having Perovskite structure, such as, for example, doped or undoped $BaTiO_3$, $SrTiO_3$ or $SrZrO_3$; or an oxidation film such as, for example, $Nb_2O_5$, $TiO_2$, $TaO_5$, and NiO. Preferably the resistance variable insulating material 312 is $SrTiO_3$. The shaped bottom electrode 308 and the top electrode 310 may be formed from a metal such as, for example, platinum, titanium or gold, or other suitable materials such as, for example, $SrRuO_3$.

Figure 4:
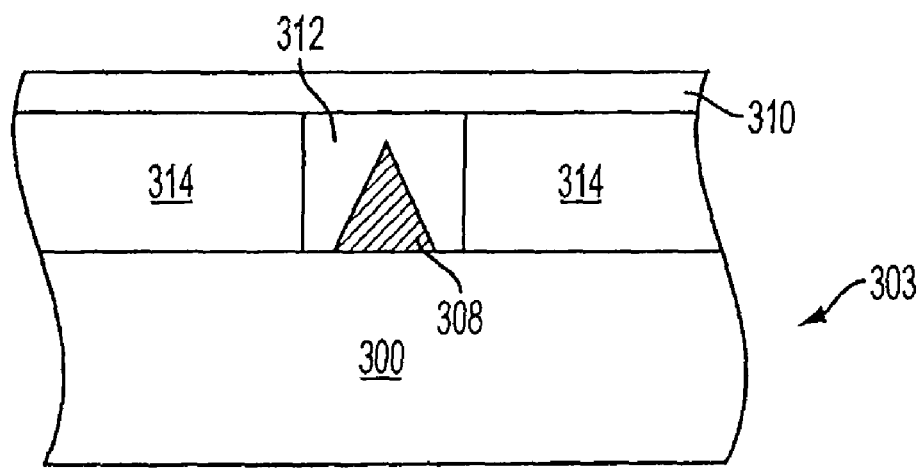
FIG. 4 illustrates a partial cross-section of a memory device in accordance with a second exemplary embodiment of the present invention.

Reference is now made to FIG. 4. FIG. 4 is similar to FIG. 3 and illustrates a memory device 303 where the resistance variable insulating material 312 has been planarized before the top electrode 310 has been formed over the substrate 300.

Figure 5:
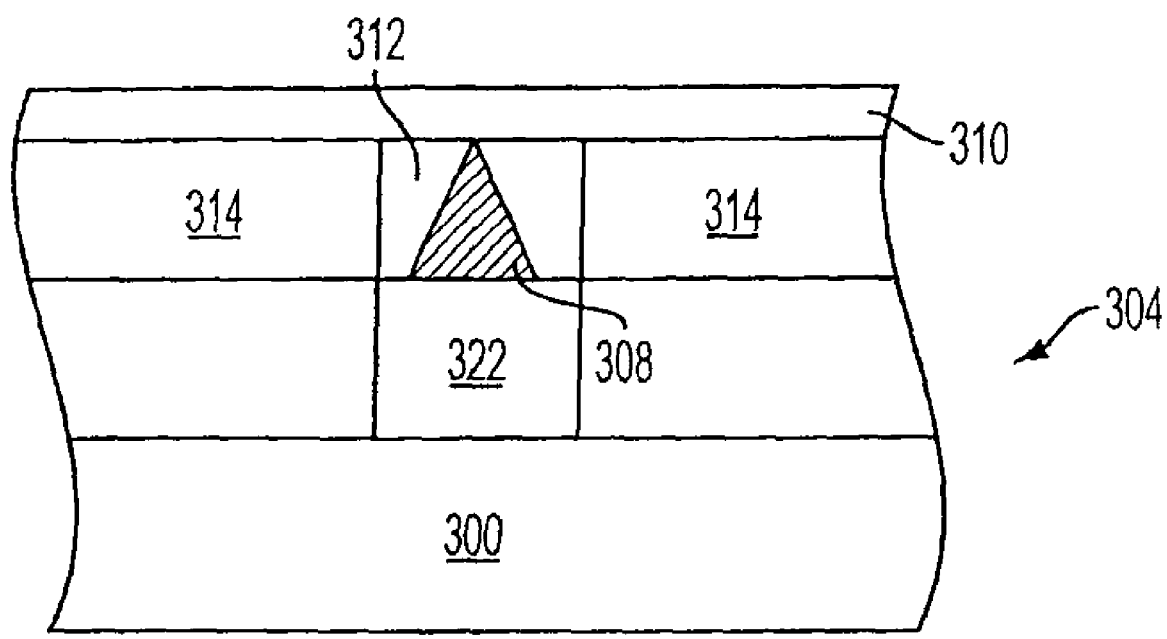
FIG. 5 illustrates a partial cross-section of a memory device in accordance with a third exemplary embodiment of the present invention.

Reference is now made to FIG. 5. FIG. 5 is similar to FIGS. 3 and 4 and illustrates a memory device 304 according to a third embodiment of the present invention where the bottom electrode 308 is formed over a conductive plug 322. As discussed above with reference to FIG. 4, resistance variable insulating material 312 has been planarized before the top electrode 310 has been formed over the substrate 300. It should be understood that the resistance variable insulating material 312 may simply deposited and then have the top electrode 310 formed over the resistance variable insulating material 312, as discussed above with reference to FIG. 3.

FIGS. 6-11 depict the formation of the memory device 301 according to an exemplary embodiment of the invention. No particular order is required for any of the actions described herein, except for those logically requiring the results of prior actions. Accordingly, while the actions below are described as being performed in a general order, the order is exemplary only and can be altered if desired.

Figure 6:
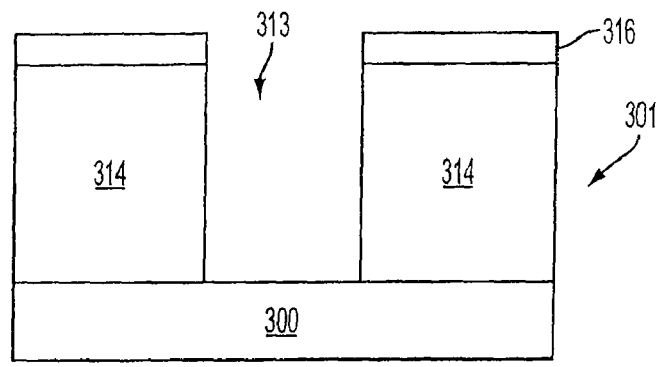
FIG. 6 illustrates a cross-sectional view of a semiconductor wafer undergoing the process of forming a memory device according to an exemplary embodiment of the present invention.

FIG. 6 illustrates a dielectric layer 314 formed over the substrate 300. The dielectric layer 314 may be formed by any known deposition methods, such as sputtering by chemical vapor deposition (CVD), plasma enhanced CVD (PECVD) or physical vapor deposition (PVD). The dielectric layer 314 may be formed of a conventional insulating oxide, such as silicon oxide ($SiO_2$), a silicon nitride ($Si_3N_4$); a low dielectric constant material; among others.

A mask 316 is formed over the dielectric layer 314. In the illustrated embodiment, the mask 316 is a photoresist mask; the mask 316, however, could instead be any other suitable material such as, for example, a metal. An opening 313 extending to the substrate 300 is formed in the dielectric layer 314 and mask 316. The opening 313 may be formed by known methods in the art, for example, by a conventional patterning and etching process. Preferably, the opening 313 is formed by a dry etch via process to have substantially vertical sidewalls.

Figure 7:
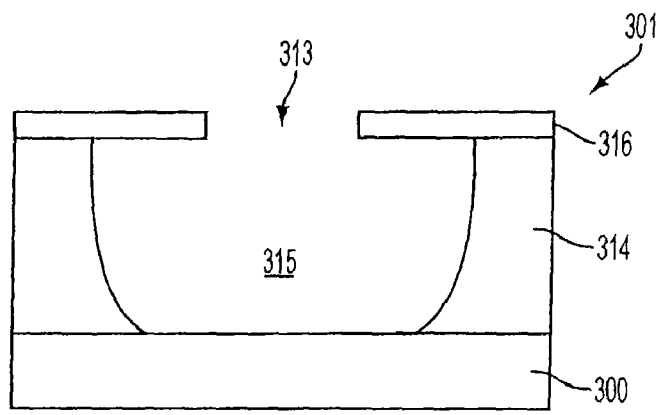
FIG. 7 illustrates the semiconductor of FIG. 6 at a stage of processing subsequent to that shown in FIG. 6.

As shown in FIG. 7, a portion of the opening 313 is widened to form an opening 315 within the dielectric layer 314. The opening 315 extends under the mask 316, such that the opening 313 through the mask 316 is smaller than the opening 315 through the dielectric layer 314. Preferably, the opening 315 is formed using a wet etch process.

Figure 8:
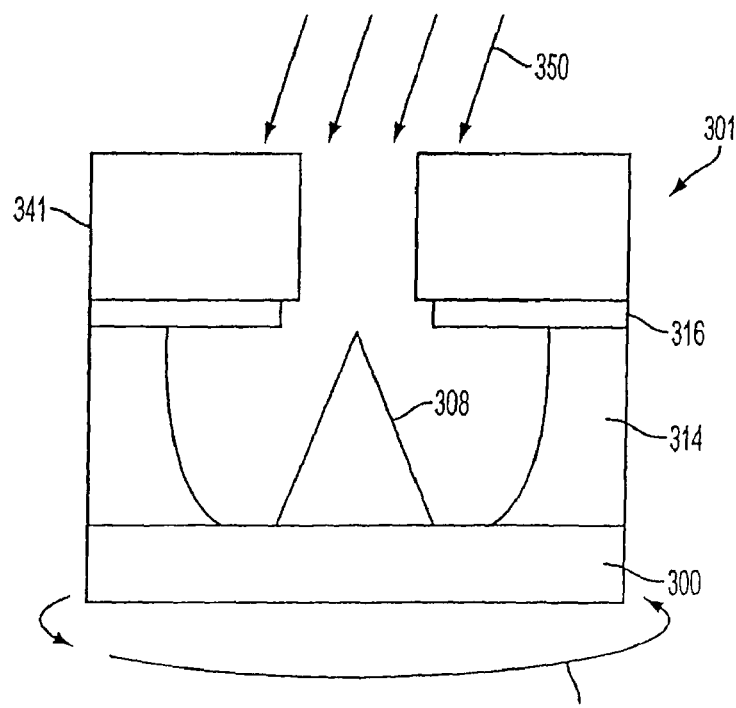
FIG. 8 illustrates the semiconductor of FIG. 6 at a stage of processing subsequent to that shown in FIG. 7.

FIG. 8 depicts the formation of the shaped bottom electrode 308. A conductive material is deposited on the mask 316 and through the openings 313, 315 onto the substrate 300 to form a cone-like shaped bottom electrode 308 and a conductive layer 341 over the mask 316. The shaped bottom electrode 308 may comprise any conductive material, for example, platinum, titanium or gold, or other suitable materials such as, for example, $SrRuO_3$. The conductive material is deposited by a physical vapor deposition (PVD) process, such as evaporation or collimated sputtering, but any suitable technique may be used. As indicated by arrow 351, the substrate 300 is rotated during deposition of the conductive material. Additionally, as indicated by arrows 350, the conductive material is deposited in a single direction. Preferably, as shown in FIG. 8 by the angle of the arrows 350, the conductive material is deposited at an angle less than approximately 75 degrees with respect to the top surface of the substrate 300, but the conductive material can also deposited at an angle of approximately 75 degrees if desired.

By forming the shaped bottom electrode 308 using a PVD process, the seams or gaps that occur when an electrode is formed in the conventional chemical vapor deposition (CVD)

plug process can be avoided. Additionally, PVD deposited material tends to have a smoother surface than CVD deposited material. Accordingly the shaped bottom electrode 308 may have a smoother surface than conventional electrodes.

Figure 9:
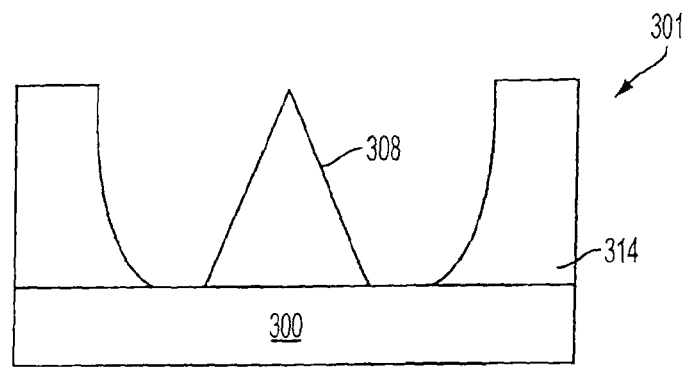
FIG. 9 illustrates the semiconductor wafer of FIG. 6 at a stage of processing subsequent to that shown in FIG. 8.

The conductive layer 341 and the mask 316 are removed, as illustrated in FIG. 9. This can be accomplished by any suitable technique. For example, a chemical mechanical polish (CMP) step can be conducted or a solvent lift-off process may be used according to known techniques.

Figure 10:
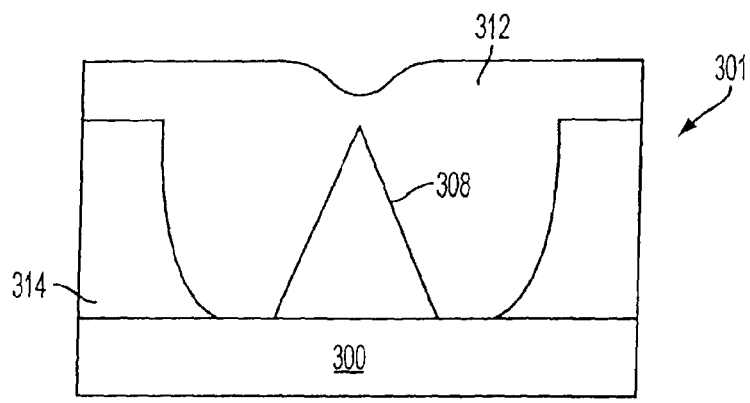
FIG. 10 illustrates the semiconductor wafer of FIG. 6 at a stage of processing subsequent to that shown in FIG. 9.

Referring to FIG. 10, a resistance variable insulating material layer 312 is formed within the opening 315 and surrounding the shaped bottom electrode 308. The resistance variable insulating material layer 312 is formed from resistance-reversible materials such as colossal magnet resistive thin films, such as, for example a PCMO thin film (i.e., $Pr_{0.7}Ca_{0.3}MnO_3$); oxidation films having Perovskite structure, such as, for example, doped or undoped $BaTiO_3$, $SrTiO_3$ or $SrZrO_3$; or an oxidation film such as, for example, $Nb_2O_5$, $TiO_2$, $TaO_5$, and NiO. Preferably the resistance variable insulating material 312 is $SrTiO_3$. The resistance variable insulating material 312 is formed by known methods, such as, for example, pulsed laser deposition (PLD), PVD, sputtering, or CVD.

Figure 11:
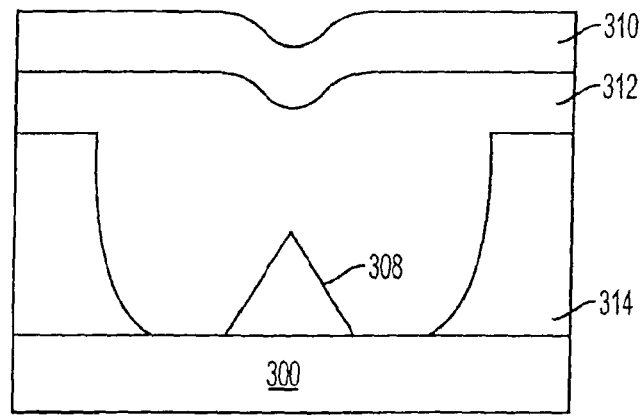
FIG. 11 illustrates the semiconductor wafer of FIG. 6 at a stage of processing subsequent to that shown in FIG. 10.

Referring to FIG. 11, a second electrode 310 is formed over the resistance variable insulating material layer 312. The second electrode 310 may comprise any electrically conductive material, for example, platinum, titanium or gold, or other suitable materials such as, for example, $SrRuO_3$.

Conventional processing steps can then be carried out to electrically couple the memory device 301 to various circuits of a memory array.

Figure 12:
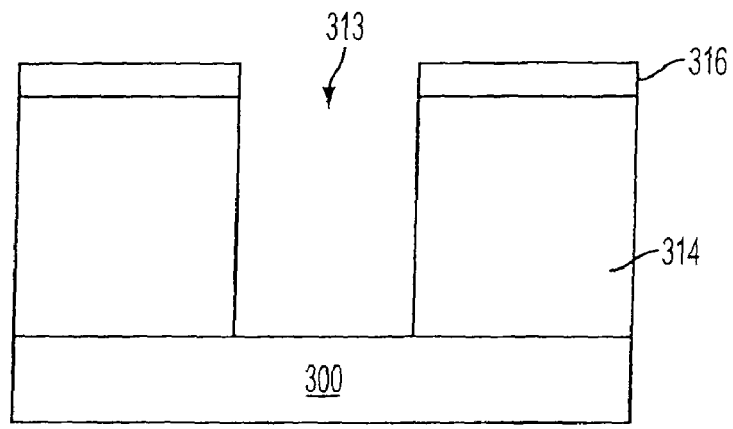
FIG. 12 illustrates a cross-sectional view of a semiconductor wafer undergoing a second process for forming a memory device according to an exemplary embodiment of the present invention.
Figure 13:
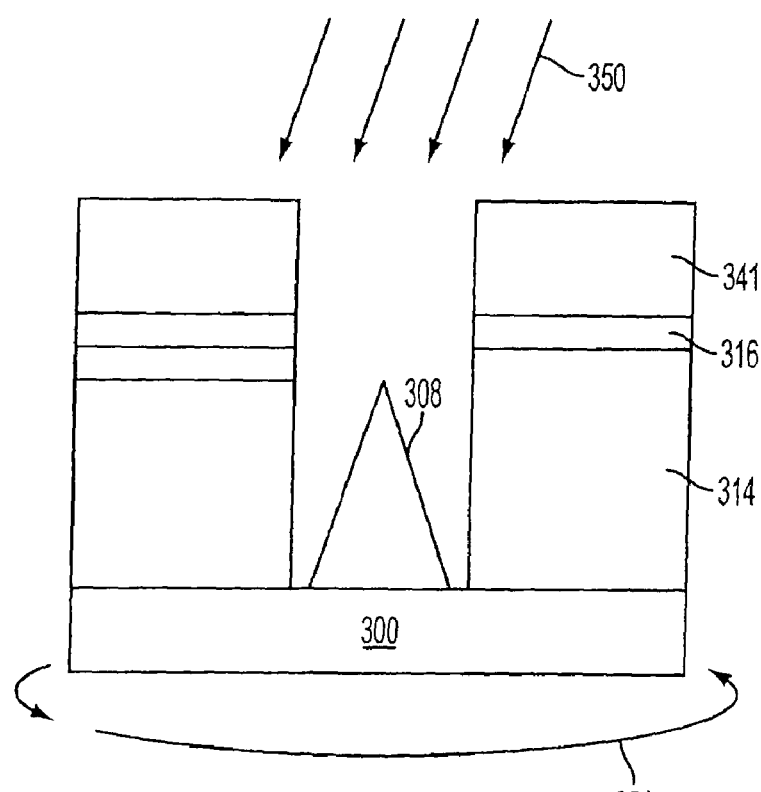
FIG. 13 illustrates the semiconductor of FIG. 12 at a stage of processing subsequent to that shown in FIG. 12.

FIGS. 12-13 illustrate another exemplary embodiment for forming the memory element 301 according to the invention. The embodiment illustrated in FIGS. 12-13 is similar to that described in FIGS. 6-11, except that the second opening 315 (FIG. 7) need not be formed.

As shown in FIG. 12, a mask 316, which may be a photoresist mask, is applied over dielectric layer 314 and substrate 300. An opening 313 extending to the substrate 300 is formed in the dielectric layer 314 and mask 316.

The shaped bottom electrode 308 can be formed as described above in connection with FIG. 8. A conductive material is deposited over the mask 316 and through the opening 313 onto the substrate 300 to form the shaped bottom electrode 308 and a conductive layer 341 over the mask 316 as illustrated in FIG. 13. As indicated by arrow 351, the substrate 300 is rotated during deposition of the conductive material. Additionally, as indicated by arrows 350, the conductive material is deposited in a single direction. Preferably, as shown in FIG. 13 by the angle of arrows 350, the conductive material is deposited at an angle less than approximately 75 degrees with respect to the top surface of the substrate 300, but the conductive material can also deposited at an angle less of approximately 75 degrees.

The memory device 301 is then processed as discussed above with reference to FIGS. 9-11. Conventional processing steps can then be carried out to electrically couple the memory device 301 to various circuits of a memory array.

Figure 14:
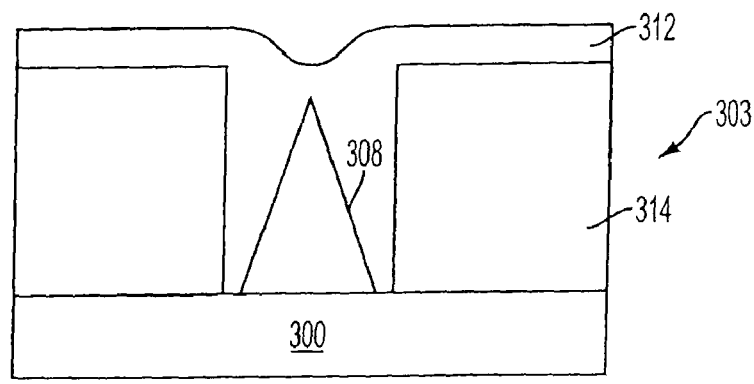
FIG. 14 illustrates a cross-sectional view of a semiconductor wafer undergoing the process of forming a memory device according to an exemplary embodiment of a second embodiment of the present invention.
Figure 15:
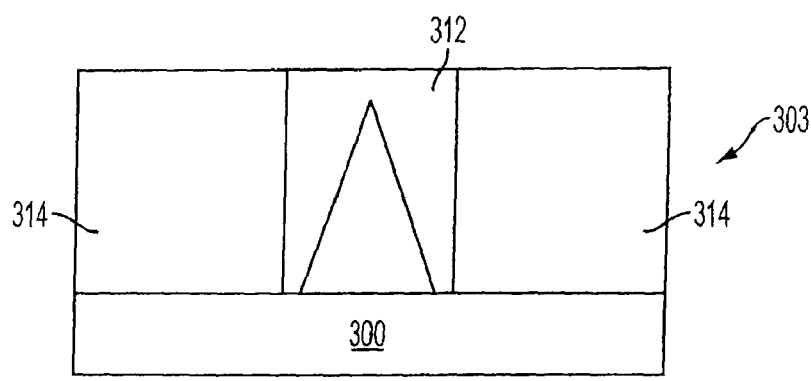
FIG. 15 illustrates the semiconductor of FIG. 14 at a stage of processing subsequent to that shown in FIG. 14.
Figure 16:
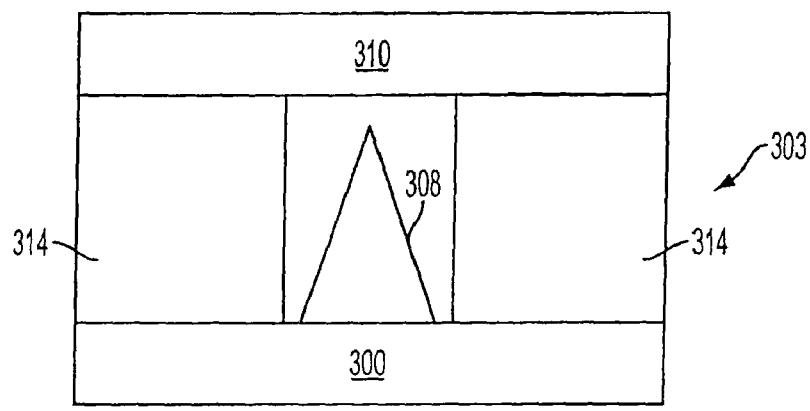
FIG. 16 illustrates the semiconductor of FIG. 14 at a stage of processing subsequent to that shown in FIG. 15.

FIGS. 14-16 depict the formation of the memory device 303 according to a second exemplary embodiment of the invention. FIG. 14 illustrates memory device which is processed as set forth above with reference to FIG. 6-10 or 12-13.

A CMP step is conducted to planarize the resistance variable insulating material layer 312 to achieve the structure shown in FIG. 15. A second electrode 310 is formed over the resistance variable insulating material layer 312 as illustrated in FIG. 16. As set forth above, the second electrode 310 may comprise any electrically conductive material, for example, platinum, titanium or gold, or other suitable materials such as, for example, $SrRuO_3$. Conventional processing steps can then be carried out to electrically couple the memory device 303 to various circuits of a memory array.

The embodiments described above refer to the formation of only a few possible resistance variable memory element structures (e.g., resistance variable memory devices) in accordance with the invention, which may be part of a memory array. It must be understood, however, that the invention contemplates the formation of other memory structures within the spirit of the invention, which can be fabricated as a memory array and operated with memory element access circuits.

Figure 17:
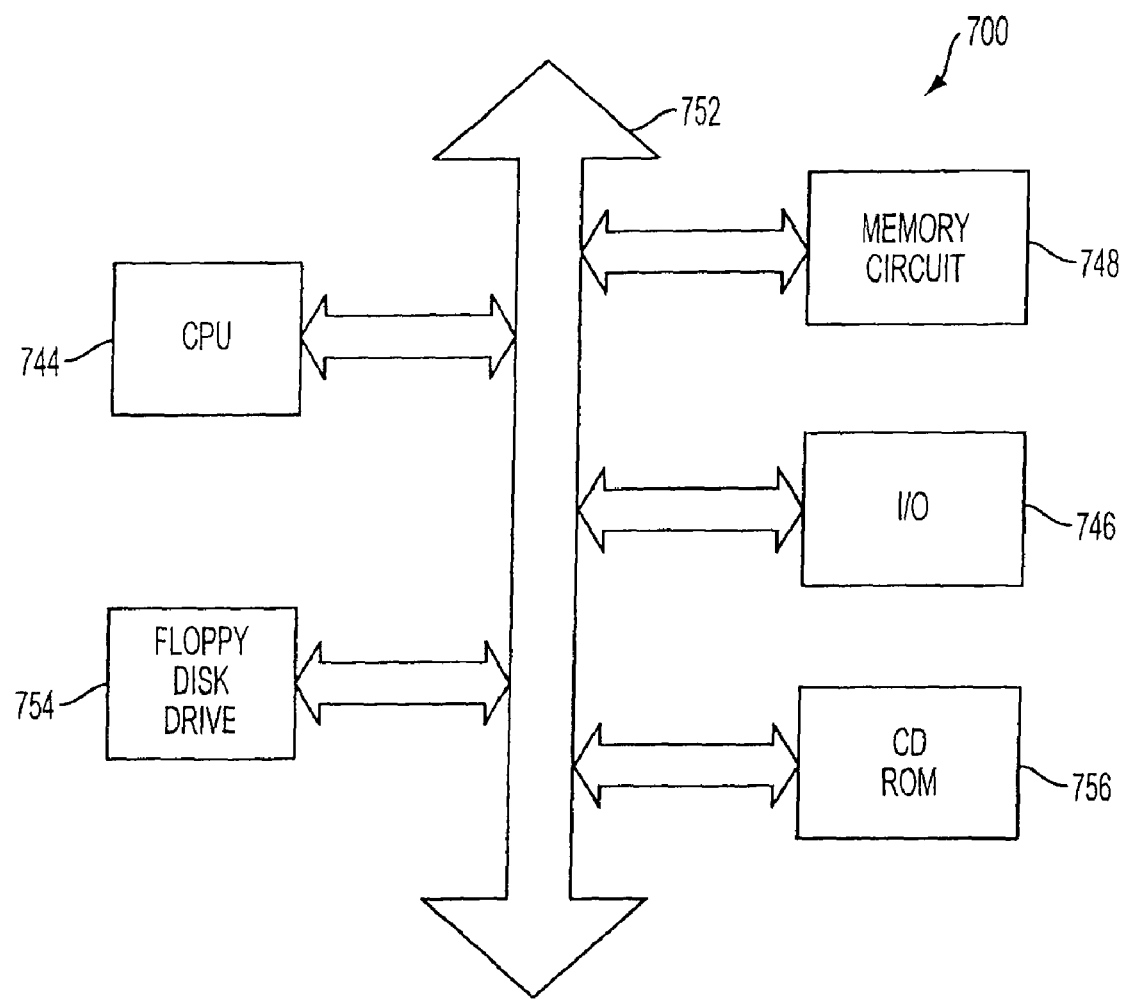
FIG. 17 illustrates a processor-based system having a memory element formed according to the present invention.

FIG. 17 illustrates a processor system 700 which includes a memory circuit 748, e.g., a memory device, which employs resistance variable memory elements (e.g., elements 301 and/or 303 (FIGS. 3 and 4, respectively)) according to the invention. The processor system 700, which can be, for example, a computer system, generally comprises a central processing unit (CPU) 744, such as a microprocessor, a digital signal processor, or other programmable digital logic devices, which communicates with an input/output (I/O) device 746 over a bus 752. The memory circuit 748 communicates with the CPU 744 over bus 752 typically through a memory controller.

In the case of a computer system, the processor system 700 may include peripheral devices such as a floppy disk drive 754 and a compact disc (CD) ROM drive 756, which also communicate with CPU 744 over the bus 752. Memory circuit 748 is preferably constructed as an integrated circuit, which includes one or more resistance variable memory elements, e.g., elements 301 and/or 303. If desired, the memory circuit 748 may be combined with the processor, for example CPU 744, in a single integrated circuit.

While the invention has been described in detail in connection with exemplary embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. A memory element comprising:
   a dielectric material formed over a substrate, said dielectric material having an opening formed therein, the opening extending from an upper surface of the dielectric material to the substrate;
   a first electrode formed over the substrate and substantially within the opening in the dielectric material, the first electrode consisting of a singular cone-like structure within the opening;
   a resistance variable insulating material formed over the first electrode, within the opening in the dielectric material, and surrounding the first electrode except along a bottom surface thereof; and
   a second electrode formed over the resistance variable insulating material.

2. The memory element according to claim 1, wherein the first electrode is selected from the group consisting of platinum, titanium, gold, and $SrRuO_3$.

3. The memory element according to claim 2, wherein the first electrode is $SrRuO_3$.

4. The memory element according to claim 2, wherein the second electrode is selected from the group consisting of platinum, titanium, gold, and $SrRuO_3$.

5. The memory element according to claim 2, wherein the resistance variable insulating material is selected from the group consisting of PCMO thin films, Perovskite structures and oxidation films.

6. The memory element according to claim 2, wherein the resistance variable insulating material is doped or undoped $BaTiO_3$, $SrTiO_3$ or $SrZrO_3$.

7. The memory element according to claim 2, wherein the resistance variable insulating material is selected from the group consisting of $Pr_{0.7}Ca_{0.3}MnO_3$, $Nb_2O_5$, $TiO_2$, $TaO_5$, and NiO.

8. The memory element according to claim 2, wherein the resistance variable insulating material is formed over the dielectric material.

9. The memory element according to claim 1, wherein the resistance variable insulating material between the first and second electrodes is planarized.

10. The memory element according to claim 1, wherein the second electrode is formed on the resistance variable insulating material.

11. The memory element according to claim 1, wherein the memory element is a resistance variable memory element.

12. The memory element according to claim 1, further comprising a conductive plug formed between the substrate and the first electrode.

13. A processor system, comprising:
a processor; and
a memory device for communicating with the processor, the memory device comprising a memory element, comprising:
a dielectric material formed over a substrate, the dielectric material having an opening formed therein, the opening extending from an upper surface of the dielectric material to the substrate;
a first electrode formed over the substrate and substantially within the opening in the dielectric material, the first electrode consisting of a singular cone-like structure within the opening;
a resistance variable insulating material formed over the first electrode, within the opening in the dielectric material, and surrounding the first electrode except along a bottom surface thereof; and
a second electrode formed over the resistance variable insulating material.

14. The processor system according to claim 13, wherein the first electrode is selected from the group consisting of platinum, titanium, gold, and $SrRuO_3$.

15. The processor system according to claim 14, wherein the first electrode is $SrRuO_3$.

16. The processor system according to claim 13, wherein the second electrode is selected from the group consisting of platinum, titanium, gold, and $SrRuO_3$.

17. The processor system according to claim 13, wherein the resistance variable insulating material is doped or undoped $BaTiO_3$, $SrTiO_3$ or $SrZrO_3$.

18. The processor system according to claim 13, wherein the resistance variable insulating material is selected from the group consisting of $Pr_{0.7}Ca_{0.3}MnO_3$, $Nb_2O_5$, $TiO_2$, $TaO_5$, and NiO.

19. The processor system according to claim 13, wherein the memory element is a resistance variable memory element.

* * * * *